US010541464B2

(12) United States Patent
Khan et al.

(10) Patent No.: US 10,541,464 B2
(45) Date of Patent: Jan. 21, 2020

(54) MICROWAVE ANTENNA COUPLING APPARATUS, MICROWAVE ANTENNA APPARATUS AND MICROWAVE ANTENNA PACKAGE

(71) Applicant: Sony Corporation, Tokyo (JP)

(72) Inventors: Wasif Tanveer Khan, Stuttgart (DE); Mudassar Nauman, Stuttgart (DE); Arndt Thomas Ott, Stuttgart (DE); Ramona Hotopan, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 82 days.

(21) Appl. No.: 15/866,904

(22) Filed: Jan. 10, 2018

(65) Prior Publication Data

US 2018/0205134 A1 Jul. 19, 2018

(30) Foreign Application Priority Data

Jan. 17, 2017 (EP) ...................................... 17151835

(51) Int. Cl.
| | |
|---|---|
| *H01Q 1/50* | (2006.01) |
| *H01Q 1/22* | (2006.01) |
| *H01Q 1/52* | (2006.01) |
| *H01Q 5/314* | (2015.01) |
| *H01Q 23/00* | (2006.01) |
| *H01P 1/04* | (2006.01) |

(52) U.S. Cl.
CPC ............. *H01Q 1/2283* (2013.01); *H01P 1/04* (2013.01); *H01Q 1/526* (2013.01); *H01Q 5/314* (2015.01); *H01Q 23/00* (2013.01)

(58) Field of Classification Search
CPC ...... H01Q 1/245; H01Q 15/006; H01Q 23/00; H01L 2223/6605; H01L 2223/6622; H01L 23/481
USPC .......................... 343/850, 731, 722, 845, 739
See application file for complete search history.

(56) References Cited

U.S. PATENT DOCUMENTS

| 7,504,721 B2 | 3/2009 | Chen et al. |
| 8,174,451 B2 | 5/2012 | Rofougaran |

(Continued)

OTHER PUBLICATIONS

M. Wojnowski, et al. "Embedded Wafer Level Ball Grid Array (eWLB) Technology for Millimeter-Wave Applications", Proc. IEEE 13th Electronics Packaging Technology Conference (EPTC2011), Singapore, Singapore, 2011, 7 pages.

(Continued)

*Primary Examiner* — Hai V Tran
*Assistant Examiner* — Collin Dawkins
(74) *Attorney, Agent, or Firm* — Xsensus LLP

(57) ABSTRACT

A microwave antenna coupling apparatus forming an eWLB package, comprises an antenna coupling element comprising a coupling unit, a coupling feed line arranged on a first surface of the coupling unit and an internal coupling component to provide signal coupling between the coupling feed line and the second surface of the coupling unit, wherein the antenna coupling element is arranged within the mold layer separate from the semiconductor element and such that an outer surface of the coupling feed line is not covered by mold material. Different multi-layer antenna structures can be placed on top of eWLB package. By this type of integration Package-on-Package (PoP) antenna are constructed. The elements can be integrated by a standard pick and place process.

17 Claims, 15 Drawing Sheets

(56) References Cited

U.S. PATENT DOCUMENTS

| | | | |
|---|---|---|---|
| 8,278,749 | B2 | 10/2012 | Lachner et al. |
| 9,024,429 | B2 | 5/2015 | Yap |
| 2013/0154091 | A1 | 6/2013 | Wright et al. |
| 2013/0201072 | A1* | 8/2013 | Alexopoulos .......... H01Q 19/10 343/834 |
| 2014/0008785 | A1 | 1/2014 | Lin et al. |
| 2015/0061924 | A1 | 3/2015 | Binzer et al. |
| 2015/0084194 | A1* | 3/2015 | Molzer ................ H01L 23/481 257/741 |
| 2016/0049723 | A1 | 2/2016 | Baks et al. |
| 2016/0113108 | A1 | 4/2016 | Sundaram et al. |
| 2017/0236776 | A1* | 8/2017 | Huynh ............... H01L 23/3677 257/428 |
| 2017/0324135 | A1* | 11/2017 | Blech ...................... H01P 3/121 |

OTHER PUBLICATIONS

Alexander Fischer, et al. "A 77-Ghz Antenna in Package", Proc. 41$^{st}$ European Microwave Conference (EuMC2011), Manchester, UK, 2011, 4 pages.

Mahmoud Al Henawy, et al. "Integrated Antennas in eWLB Packages for 77 GHz and 79 Ghz Automotive Radar Sensors", Proc. 41$^{st}$ European Microwave Conference (EuMC2011), Manchester, UK, 2011, 4 pages.

Abouzar Hamidipour, et al. "A Rhombic Antenna Array Solution in eWLB Package for Millimeter-Wave Applications", Proc. 42$^{nd}$ European Microwave Conference (EuMC2012), Amsterdam, Netherlands, 2012, 4 pages.

Z. Tong, et al. "Wideband Differential Antenna in Package with Superstrate Structure at 77GHz", Proc. IEEE Asia-Pacific Conference on Antennas and Propagation (APCAP2012), Singapore, Singapore, 2012, 4 pages.

M. Pourmousavi, et al. "Antenna Design and Characterization for a 61 GHz Transceiver in eWLB Package", Proc. 43$^{rd}$ European Microwave Conference (EuMC2013), Nuremberg, Germany, 2013, 4 pages.

Abouzar Hamidipour, et al. "Antennas in Package With Stacked Metallization", Proc. 43$^{rd}$ European Microwave Conference (EuMC2013), Nuremberg, Germany, 2013, 4 pages.

Abouzar Hamidipour, et al. "160-GHz SiGe-Based Transmitter and Receiver With Highly Directional Antennas in Package", Proc. 8$^{th}$ European Microwave Integrated Circuits Conference (EuMIC2013), Nuremberg, Germany, 2013, 4 pages.

Alexander Fischer, et al. "77-GHz Multi-Channel Radar Transceiver With Antenna in Package", IEEE Transactions on Antennas and Propagation, vol. 62, No. 3, 2014, 9 pages.

E. Seler, et al. "Chip-to-Rectangular Waveguide Transition Realized in embedded Wafer Level Ball Grid Array (eWLB) Package", Proc. 64$^{th}$ Electronic Components and Technology Conference (ECTC), Orlando, FL, USA, 2014, 4 pages.

E. Seler, et al. "3D Rectangular Waveguide Integrated in embedded Wafer Level Ball Grid Array (eWLB) Package", 2014 IEEE 64$^{th}$ Electronic Components and Technology Conference (ECTC), 2014, 7 pages.

\* cited by examiner

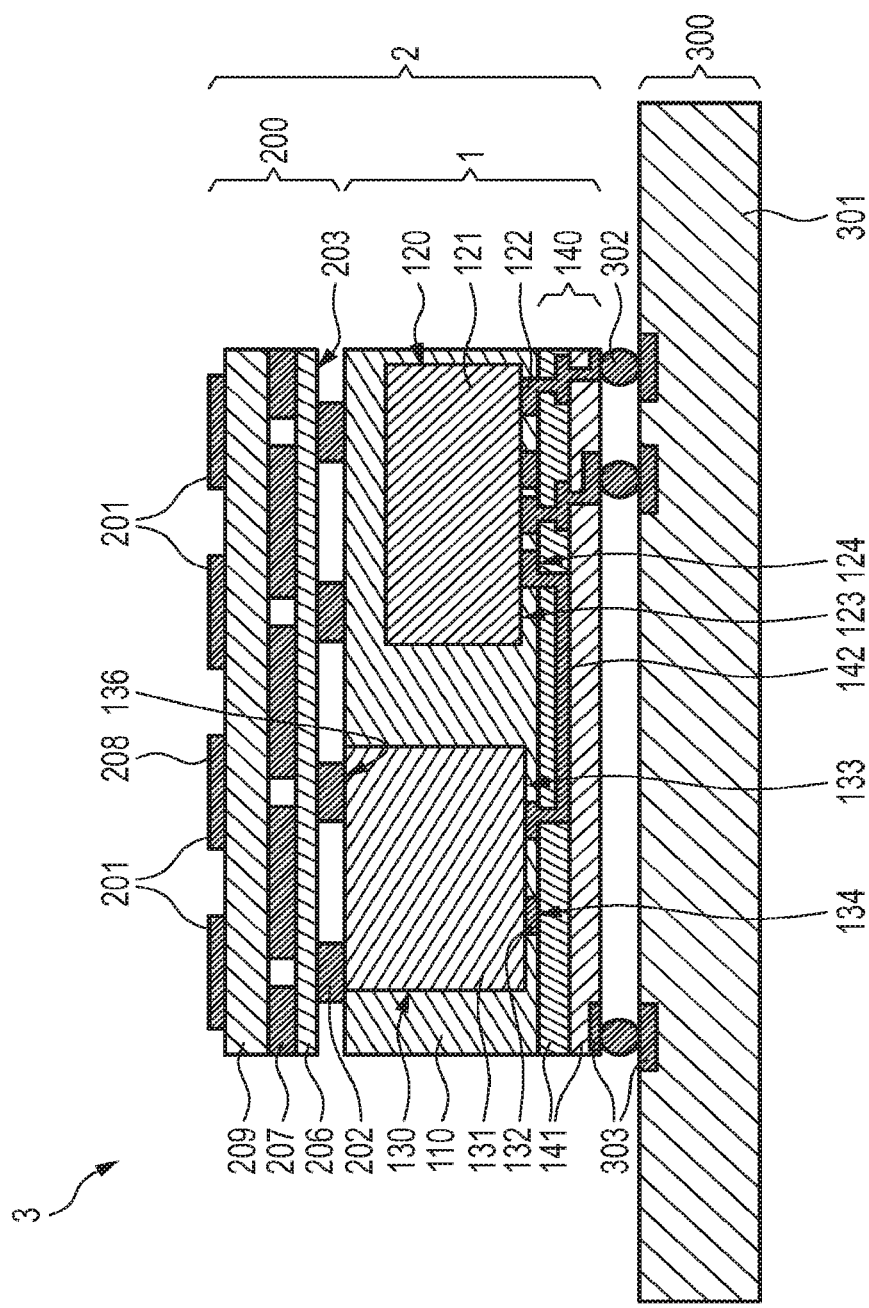

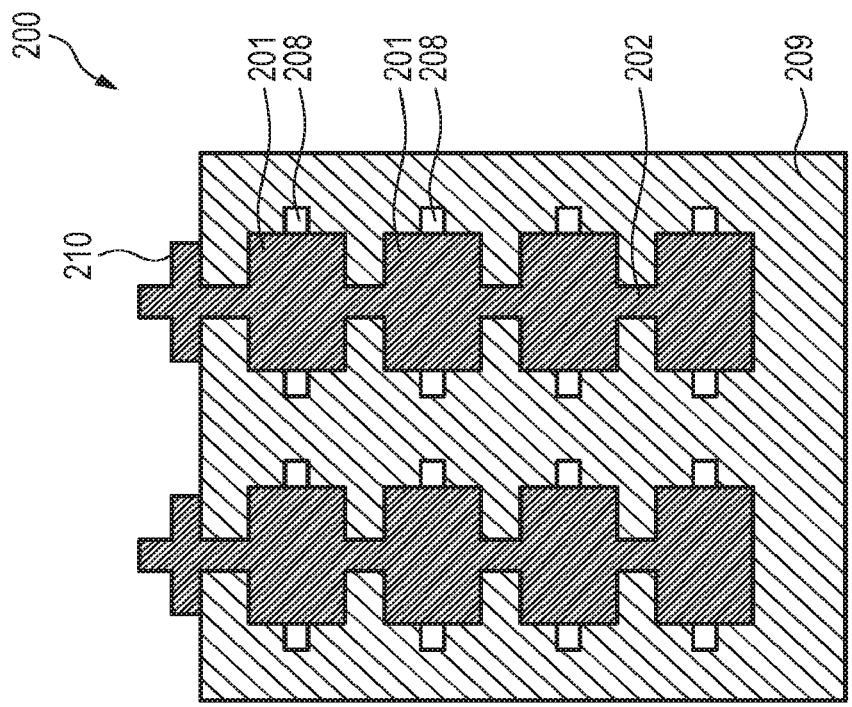
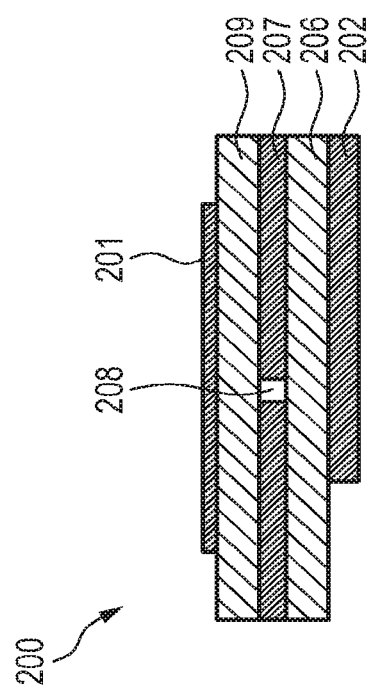
Fig. 2B
Fig. 2A

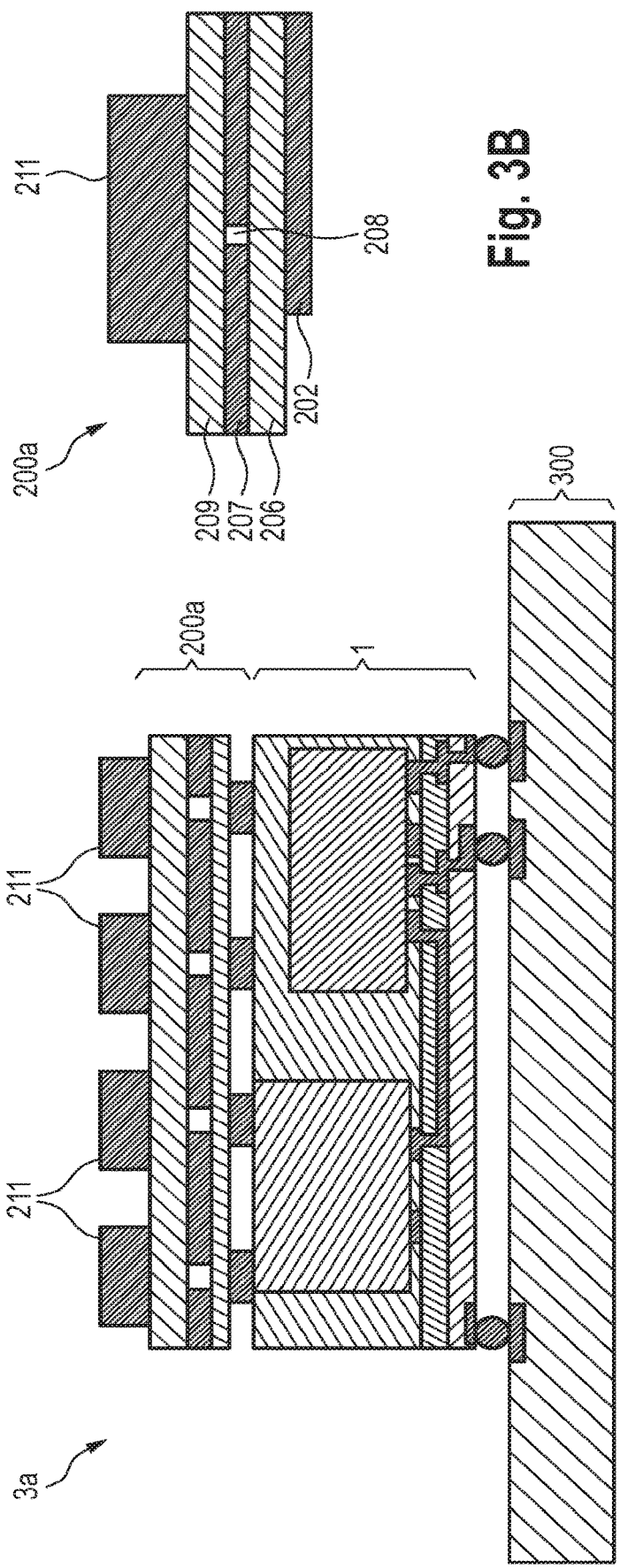

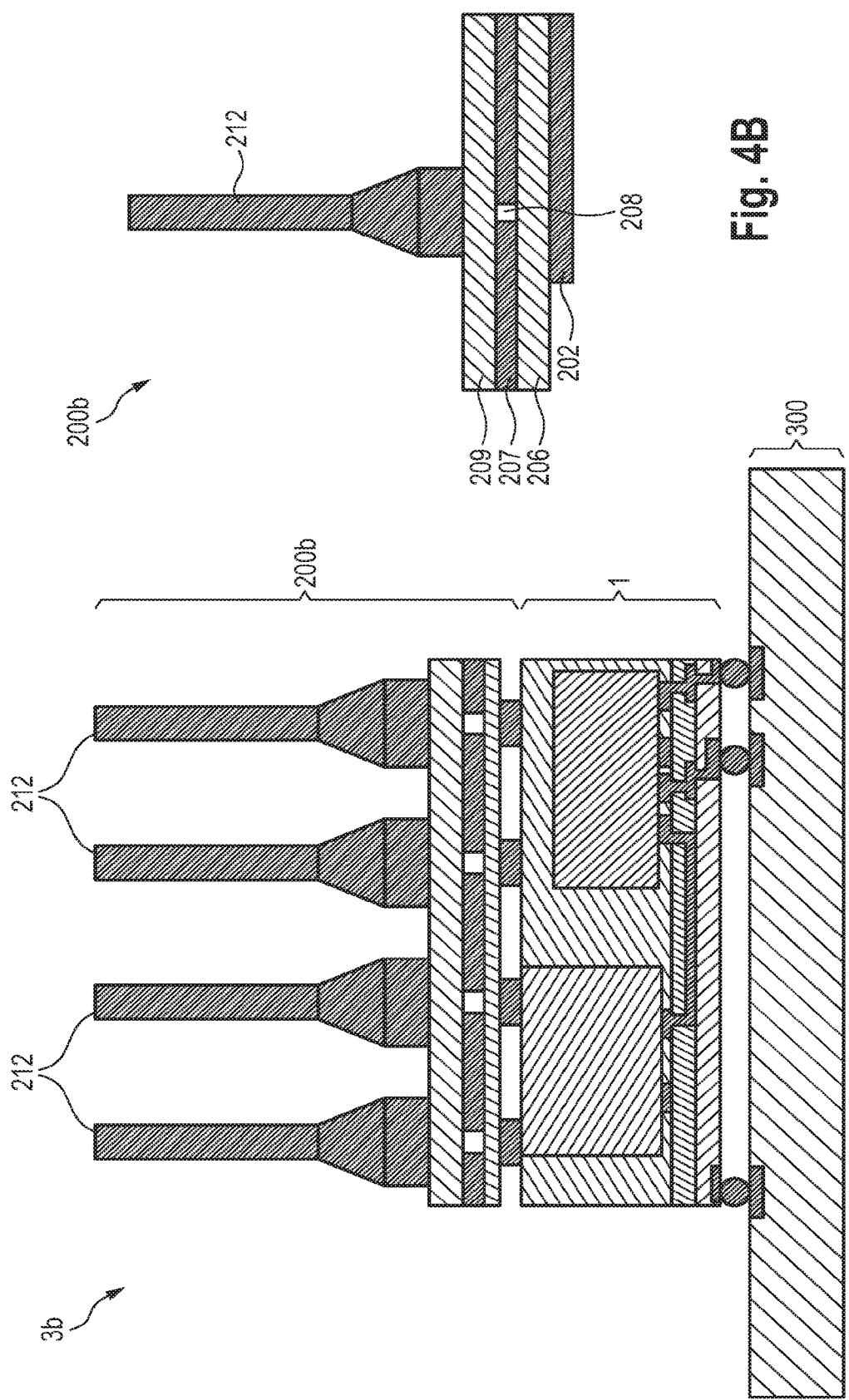

MICROWAVE ANTENNA COUPLING APPARATUS, MICROWAVE ANTENNA APPARATUS AND MICROWAVE ANTENNA PACKAGE

CROSS REFERENCE TO RELATED APPLICATIONS

The present application claims priority to European Patent Application 17 151 835.0, filed in the European Patent Office on Jan. 17, 2017, the entire contents of which being incorporated herein by reference.

BACKGROUND

Field of the Disclosure

The present disclosure relates to a microwave antenna coupling apparatus, a microwave antenna apparatus and a microwave antenna package.

Description of Related Art

Fan-out wafer level packaging technology such as the embedded wafer-level ball grid array (eWLB) has matured for microwave and mm-wave radar and communication systems over the past years. This packaging technology is the first choice for low-cost system integration of MMICs, passives, and antennas into a single plastic type package. Many different types of planar antenna structures in fan-out wafer level packages have been published, e.g. in M. Wojnowski et al., "Embedded Wafer Level Ball Grid Array (eWLB) Technology for Millimeter-Wave Applications," Proc. IEEE 13th Electronics Packaging Technology Conference (EPTC2011), Singapore, pp. 423-429, December 2011. They all have in common, that the antenna elements are printed on one or more redistribution layers (RDLs). The disadvantage of the aforementioned solutions are their narrow operating bandwidth (1-5%), distorted radiation patterns due to thick mold compound in the radiating direction, and the high amount of parasitic radiation to all directions. Further, these planar antenna structures cannot provide enough gain for the long range and medium range radar applications without an additional apparatus.

E. Seler et al., "3D rectangular waveguide integrated in embedded Wafer Level Ball Grid Array (eWLB) package", Electronic Components and Technology Conference (ECTC), 2014 IEEE 64th, pp. 956-962, 27-30 May 2014 discloses a 3D rectangular waveguide in the fan-out area of an eWLB package using laminate inserts. To obtain the waveguide side walls in eWLB, an RF laminate with microvias is inserted in the fan-out area. The classical redistribution layer (RDL) on the one surface and an additional back side metallization on the other surface of the package are used to realize the top and bottom walls of the waveguide. In this paper, two different transition designs from redistribution layer to the SIW-type transmission lines are investigated in the package level. However, the antenna design is not emphasized. These SIW-type transmission lines are realized using RF laminates which are costly.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a microwave antenna coupling apparatus, a microwave antenna apparatus and a microwave antenna package, which are radiation efficient, achieve the required bandwidth and sensitivity and can be manufactured easier and more cost-efficient, which makes them applicable as series product.

According to an aspect there is provided a microwave antenna coupling apparatus comprising:
a mold layer of mold material,
a semiconductor element comprising a semiconductor unit and a semi-conductor feed line arranged on a first surface of the semiconductor unit, wherein the semiconductor element is arranged within the mold layer such that an outer surface of the semiconductor feed line is not covered by mold material,
an antenna coupling element comprising a coupling unit, a coupling feed line arranged on a first surface of the coupling unit and an internal coupling component to provide signal coupling between the coupling feed line and the second surface of the coupling unit, wherein the antenna coupling element is arranged within the mold layer separate from the semiconductor element and such that an outer surface of the coupling feed line is not covered by mold material, and
a redistribution layer comprising at least one redistribution substrate layer and a conductive layer, wherein the redistribution layer is arranged on a first surface of the mold layer and configured such that the conductive layer connects the outer surface of the semiconductor feed line with the outer surface of the coupling feed line.

According to a further aspect there is provided a microwave antenna apparatus comprising
a microwave antenna coupling apparatus as disclosed herein and
an antenna module coupled to the microwave antenna coupling apparatus on a surface opposite the redistribution layer, said antenna module comprising one or more antenna elements.

According to a further aspect there is provided a microwave antenna package comprising
a PCB arrangement comprising a PCB layer and
a microwave antenna apparatus as disclosed herein coupled to the PCB arrangement.

Embodiments are defined in the dependent claims. It shall be understood that the disclosed microwave antenna apparatus and microwave antenna package all have similar and/or identical further embodiments as the claimed microwave antenna coupling apparatus and as defined in the dependent claims and/or disclosed herein.

One of the aspects of the disclosure is to enable the placing of different antenna modules, e.g. multi-layer antenna structures, on top of an microwave antenna coupling apparatus, e.g. on top of an eWLB package formed by a microwave antenna coupling apparatus, a PCB arrangement and a microwave antenna apparatus. This type of integration could be called Package-on-Package (PoP) antennas. The elements can be integrated by a standard pick and place process.

This concept opens up the opportunity for different types of antennas that are not possible with known concepts because of eWLB package size limitations, non-desired results caused by epoxy, reflector on the PCB, etc. Various antennas types can thus be integrated with eWLB since the antenna is realized as a separate module and placed on top of eWLB package using a pick and placer device or additional redistribution layer(s) on top of the microwave antenna coupling apparatus.

Further, this PoP antenna concept integrated with eWLB technology allows reducing beam widths or forming a beam with different desired beam widths by using large antenna arrays. Ground plane can be placed at the interface of epoxy or at any layer of the antenna coupling block or in the PoP antenna module to isolate the antenna from epoxy.

It shall be understood that according to the present disclosure the antenna may be used generally in the frequency range of millimeter waves and microwaves, i.e. in at least a frequency range from 3 GHz to 3 THz, in particular above 30 GHz. The "operating frequency" may generally be any frequency within this frequency range. When using the term "microwave" and/or "mm-wave" herein any electromagnetic radiation within this frequency range shall be understood. Within this frequency range, the antennas are fitting into eWLB packages due to their size, ranging from cm to mm range. The antenna size is dependent on the operating frequency.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWING

A more complete appreciation of the disclosure and many of the attendant advantages thereof will be readily obtained as the same becomes better understood by reference to the following detailed description when considered in connection with the accompanying drawings, wherein:

FIG. 1 shows a cross-sectional view of an embodiment of a microwave antenna package according to the present disclosure including a patch antenna module, FIG. 2A shows a cross-sectional view of the patch antenna module used in the microwave antenna package shown in FIG. 1, FIG. 2B shows a top view of the patch antenna module used in the microwave antenna package shown in FIG. 1, FIG. 3A shows a cross-sectional view of an embodiment of a microwave antenna package according to the present disclosure, FIG. 3B shows a cross-sectional view of dielectric resonator antenna module according to the present disclosure, FIG. 4A shows a cross-sectional view of an embodiment of a microwave antenna package according to the present disclosure, FIG. 4B shows a cross-sectional view of dielectric rod antenna module according to the present disclosure.

DETAILED DESCRIPTION OF THE EMBODIMENTS

Figure 5:
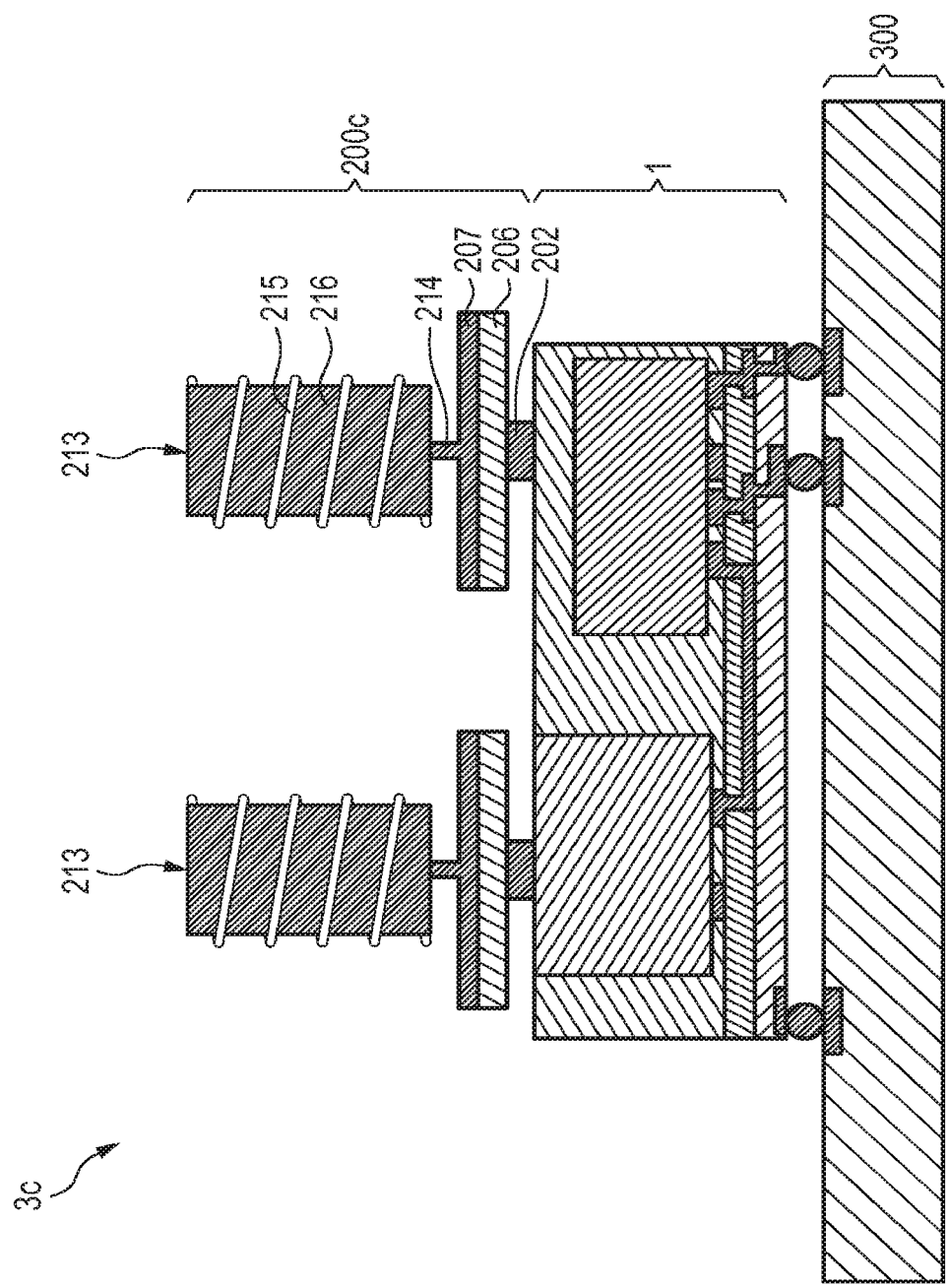
FIG. 5 shows a cross-sectional view of an embodiment of a microwave antenna package according to the present disclosure including a helix antenna module.

Referring now to the drawings, wherein like reference numerals designate identical or corresponding parts throughout the several views, FIG. 1 shows a cross-sectional view of a first embodiment of a microwave antenna package 3 according to the present disclosure. The microwave antenna package 3 comprises a PCB arrangement 300 comprising a PCB layer 301 and a microwave antenna apparatus 2 according to the present disclosure, which is coupled to the PCB arrangement 300, e.g. via solder balls 302 and under bump metallization 303 in this embodiment. The microwave antenna apparatus 2 comprises a microwave antenna coupling apparatus 1 according to the present disclosure and an antenna module 200 is coupled to the microwave antenna coupling apparatus 1.

The microwave antenna coupling apparatus 1 comprises a mold layer 110 of mold material (e.g. epoxy), a semiconductor element 120, an antenna coupling element 130, and a redistribution layer 140.

The semiconductor element 120 comprises a semiconductor unit 121 and a semiconductor feed line 122 arranged on a first surface 123 of the semiconductor unit 121. The semiconductor element 120 is arranged within the mold layer 110 such that an outer surface 124 of the semiconductor feed line 122 is not covered by mold material of the mold layer 110.

The antenna coupling element 130 comprises a coupling unit 131, a coupling feed line 132 (also called feed network) arranged on a first surface 133 of the coupling unit 131 and an internal coupling component 135 to provide signal coupling between the coupling feed line 132 and the second surface 136 of the coupling unit 131. The antenna coupling element 130 is arranged within the mold layer 110 separate from the semiconductor element 120 and such that an outer surface 134 of the coupling feed line 132 is not covered by mold material of the mold layer 110.

The redistribution layer 140 comprises at least one redistribution substrate layer 141 and a metal layer 142 (or, more generally, a conductive layer). The redistribution layer 140 is arranged on a first surface 111 of the mold layer 110 and configured such that the metal layer 142 connects the outer surface 124 of the semiconductor feed line 122 with the outer surface 134 of the coupling feed line 132.

The antenna module 200 comprises one or more antenna elements 201 and is coupled to the microwave antenna coupling apparatus 1 on a surface opposite the redistribution layer 140. Further, the antenna module 200 comprises an antenna feed line 202 (also called microstrip feeding network) arranged in or on a surface 203 of the antenna module facing the microwave antenna coupling apparatus 1 and coupling the one or more antenna elements 201 to the antenna coupling element 130 of the microwave antenna coupling apparatus 1. Then antenna module 200 further comprises first substrate layer 206, a ground plane 207 comprising aperture slots 208 and a second substrate layer 209, on top of which the antenna elements 201 are formed.

The embodiment shown in FIG. 1 thus uses an aperture coupled patch antenna module 200 placed on eWLB package (formed by the microwave antenna coupling apparatus 1), which is further flip-chipped on PCB layer 301 to make a complete functional system (the microwave antenna package). This antenna module 200 could be a single antenna or an array of antennas. The antenna coupling element 130 may comprises one block or multiple blocks feeding different antennas. If the feed network, i.e. the coupling feed line 132, is designed on a PoP module, then only one block could be sufficient to feed the antenna. There is a restriction to place multiple antenna coupling elements in an eWLB package dictated by some fabrication limitations (such as a certain epoxy to SMT components area-ratio). The antenna coupling element 130 thus connects the feed network 132 to the microstrip feeding network 202. The antenna coupling element 130 can have different types of transitions, as will be explained below.

FIG. 2A shows a cross-sectional view and FIG. 2B shows a top view of the aperture coupled patch antenna module 200 used in the microwave antenna package shown in FIG. 1. The microwave feeding network 202 may be designed using corporate feeding or other methods. For feeding the microwave feeding network 202 feeding connectors 210 on one side of the antenna module 200 may be used, in particular for stand-alone antennas.

Likewise, many other antennas like dipole antennas, folded dipole antennas, monopole antennas, substrate integrated waveguide (SIW) slot antennas, fractal antennas, slot antennas, and different antenna arrays can be used in this configuration. Any type of substrate such as FR4, organic substrates, ceramic substrates, Teflon, flexible or rigid substrates can be used as to fabricate these package-on-package antenna modules. The size of antenna modules can be made larger than the eWLB package to create more area to design highly directional antenna beams and also allow beam forming functionality. This flexibility is not available if antennas are embedded in epoxy.

As mentioned above, another antenna that can be used is a dielectric resonator antenna (DRA), which can be placed on the microwave antenna coupling apparatus 1. An embodiment of a microwave antenna package 3a including a dielectric resonator antenna module 200a is shown in FIGS. 3A and 3B, wherein FIG. 3A shows a cross-sectional view of the such a microwave antenna package 3a and FIG. 3B shows a cross-sectional view of such an antenna module 200a. Instead of the patent antenna elements 201 shown in FIGS. 1 and 2, DRA elements 211 are placed on top of the substrate layer 209. All other elements of the microwave antenna package 3a are generally identical to the corresponding elements of the microwave antenna package 3.

The DRA elements 211 can be made of any high dielectric constant or ceramic material such as marble (having a dielectric constant of $\varepsilon_r=8.3$), Rogers RO3210™ ($\varepsilon_r=10.2$), Rogers RO3010™ ($\varepsilon_r=10.2$), Rogers RT/6010LM™ ($\varepsilon_r=10.2$), or Rogers TMM 10i™ ($\varepsilon_r=9.8$). The dimension of DRA depends on $\lambda_0/\sqrt{\varepsilon_r}$.

Integration of such antennas in an eWLB package embedded in epoxy is difficult because of the epoxy height and area limitations. The disclosed PoP package antenna concept thus allows choosing the desired and optimum height of the substrate.

Another antenna that can be realized is dielectric rod antenna, which is highly directional and enables developing narrow beam-width antennas. This concept is shown in FIGS. 4A and 4B, wherein FIG. 4A shows a cross-sectional view of a microwave antenna package 3b according to the present disclosure including a dielectric rod antenna module 200b and FIG. 4B shows a cross-sectional view of a dielectric rod antenna module 200b. In this embodiment dielectric rod antenna elements 212 are placed on top of the substrate layer 209. All other elements of the microwave antenna package 3b are generally identical to the corresponding elements of the microwave antenna package 3.

Another antenna whose integration is enabled by the disclosed PoP antenna concept is helix antenna. Such antennas can be designed at low frequencies and then integrated with eWLB package. This concept is shown in FIG. 5 showing a cross-sectional view of a microwave antenna package 3c according to the present disclosure including a helix antenna module 200c. In this embodiment helix antenna elements 213 are placed on top of the ground 207 at a feeding point 214. Most other elements of the microwave antenna package 3c are generally identical to the corresponding elements of the microwave antenna package 3. At high frequencies, the helix antenna elements 213 can be fabricated using multiple metal layers, which are interconnected together using vias. In the embodiment shown in FIG. 5 the helix antenna elements 213 are formed by helical turns 215 wound around a substrate core 216.

Likewise, spiral antennas for wide band applications can also be designed as separate antenna modules and integrated in PoP configurations.

Figure 6:
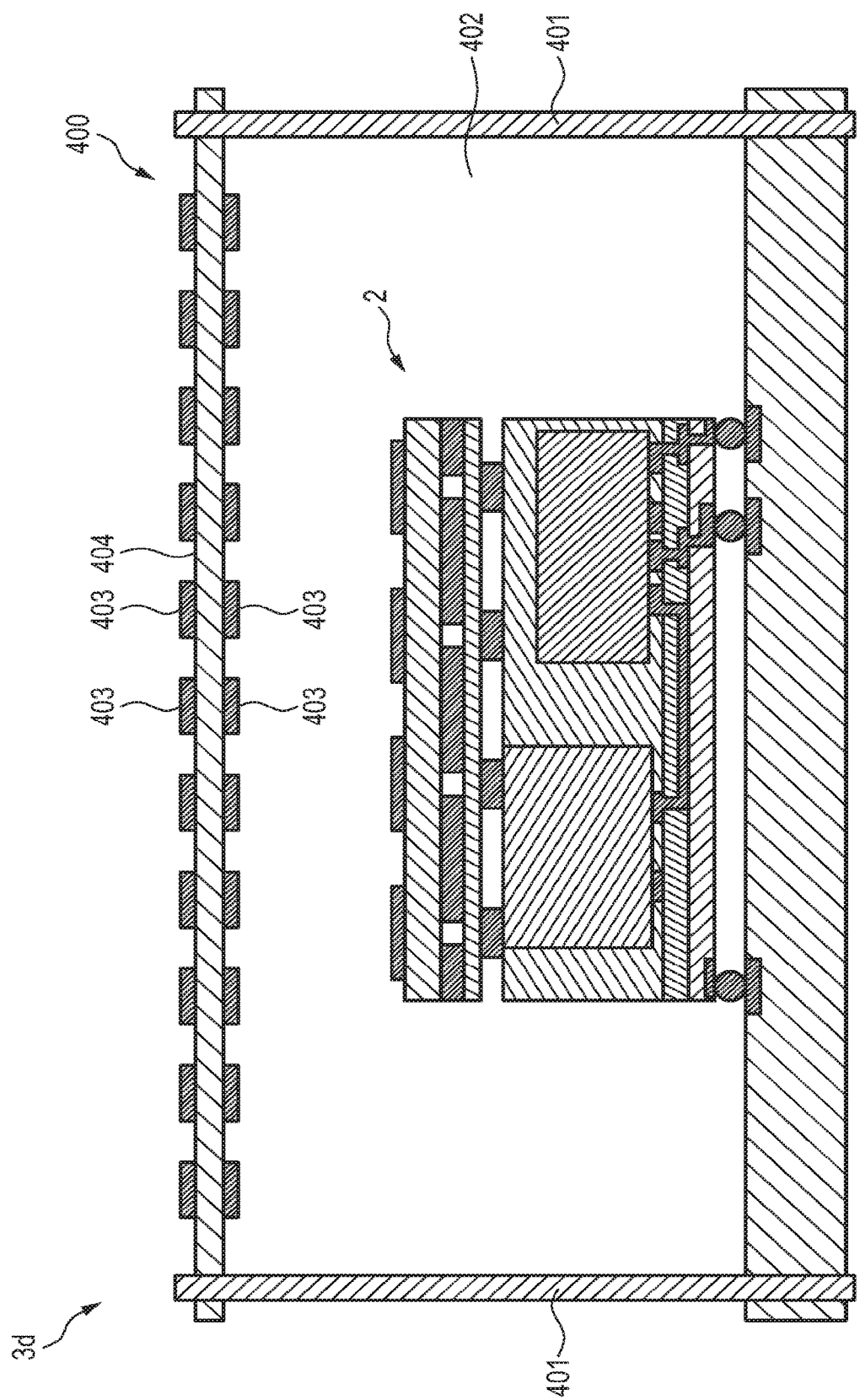
FIG. 6 shows a cross-sectional view of an embodiment of a microwave antenna package according to the present disclosure including a resonant cavity and parasitic patches.

Another antenna that can be integrated with eWLB package is an aperture coupled patch antenna with resonant cavity and parasitic patches. This concept is shown in FIG. 6 showing a cross-sectional view of a microwave antenna package 3d according to the present disclosure including a microwave antenna apparatus 2 (as shown in FIG. 1) using an aperture coupled patch antenna module 200, a frequency selective surface structure 400 and a support structure 401 for supporting the frequency selective surface structure 400. The frequency selective surface structure 400 is arranged at a distance from the microwave antenna apparatus 2 (preferably of half wavelength from the ground plane of the microwave antenna apparatus 2) on a side of the microwave antenna apparatus 2 facing away from the PCB arrangement 300. A resonant cavity 402 is thus formed. The frequency selective surface structure 400 comprises parasitic patches 403 (i.e. frequency selective surface structure elements), preferably arranged on both surfaces of a substrate 404.

Parasitic patches are normally placed at a certain distance to achieve more gain. Because of limited space and height (around 500 μm) in eWLB package, the required results may not be attached if parasitic patches are embedded in epoxy. Placing parasitic patches on top of the eWLB package achieve the desired results. The resonant cavity increases the effective aperture of the antenna and hence increases its gain and directivity.

In the microwave antenna package shown in FIG. 6, the signal from the semiconductor element 120 will feed the microstrip line 122 (see also FIG. 1). This microstrip line 122 will then, via the lines 142 and 134, feed the antenna coupling element 110. The signal from the antenna coupling element 110 will then feed the aperture coupled patch antenna module 200. The support structures 401 are used to keep about half wavelength separation between the frequency selective surfaces (FFSs) 403 and the aperture coupled patch antenna elements 201. The array of aperture coupled patch antennas 201 will feed the FFSs 403. The FFSs need to be fed in phase since the separation of half wavelength cannot be changed. Partial transmission of waves in phase results in a directive radiation pattern.

Figure 7:
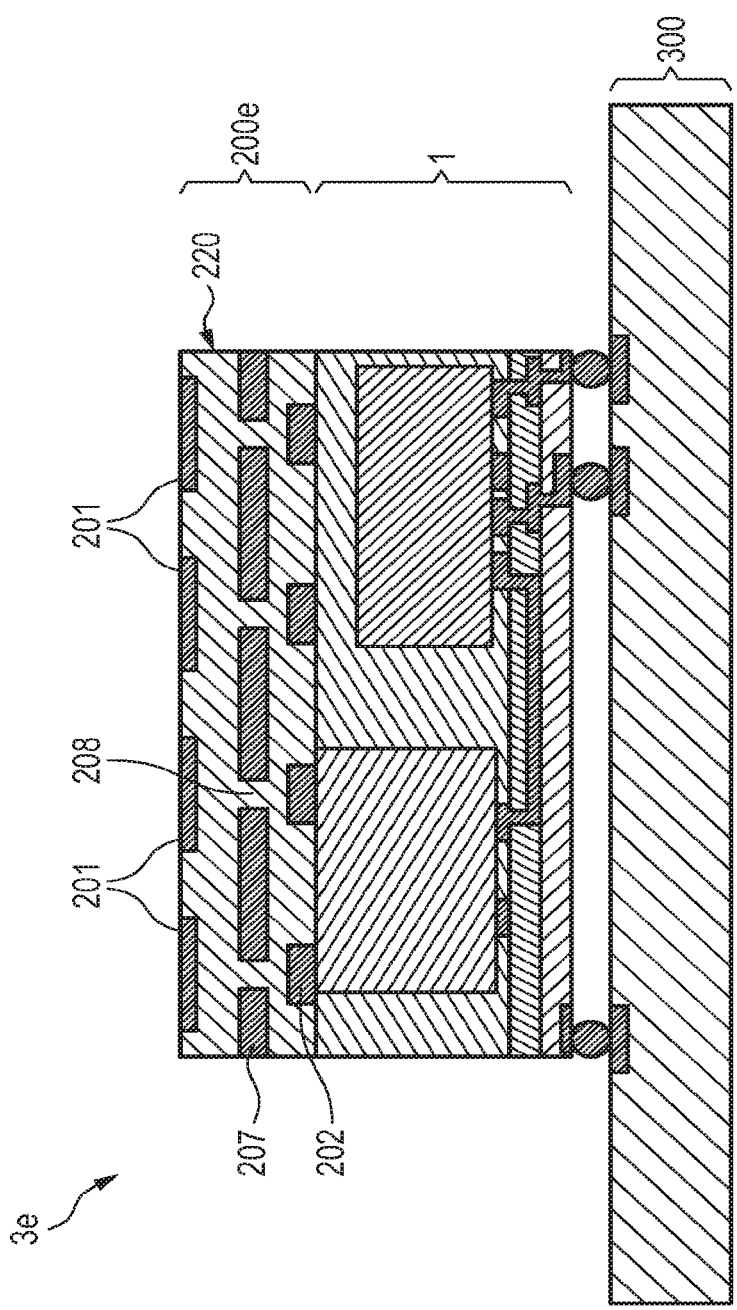
FIG. 7 shows a cross-sectional view of an embodiment of a microwave antenna package according to the present disclosure including an aperture coupled patch antenna integrated inside an RDL layer.

Flip-chip technology can be replaced by an additional RDL on the top surface of the eWLB package 1. Planar antennas can be directly integrated inside the RDL top layer, FIG. 7 shows a cross-sectional view of a microwave antenna package 3e according to the present disclosure including an aperture coupled patch antenna 200e, which has been integrated inside the RDL top layer 220. All other above mentioned antennas may alternatively be integrated or partly integrated by this technology into a microwave antenna package.

One of the challenges is to couple the signal to the antenna module 200 from the RDL layer 140. Different antenna types and their integration have been discussed above. In the following a set of solutions to couple the signal to the antenna module that is placed on top of eWLB package (i.e. the microwave antenna coupling apparatus) will be discussed. These solution include a through package via (TPV) combined with aperture coupling, micro-coaxial (by use of vias), back to back aperture coupling, waveguides (fed by an antenna), and TPV plus solder balls.

In the following, an aperture coupled antenna is chosen as an example and different coupling techniques and transitions are proposed to couple the RF signal from RDL layer to the antenna module placed on eWLB package. The same concepts can, however, also be used with other types of antennas, in particular the antennas disclosed in the foregoing.

Figure 8:
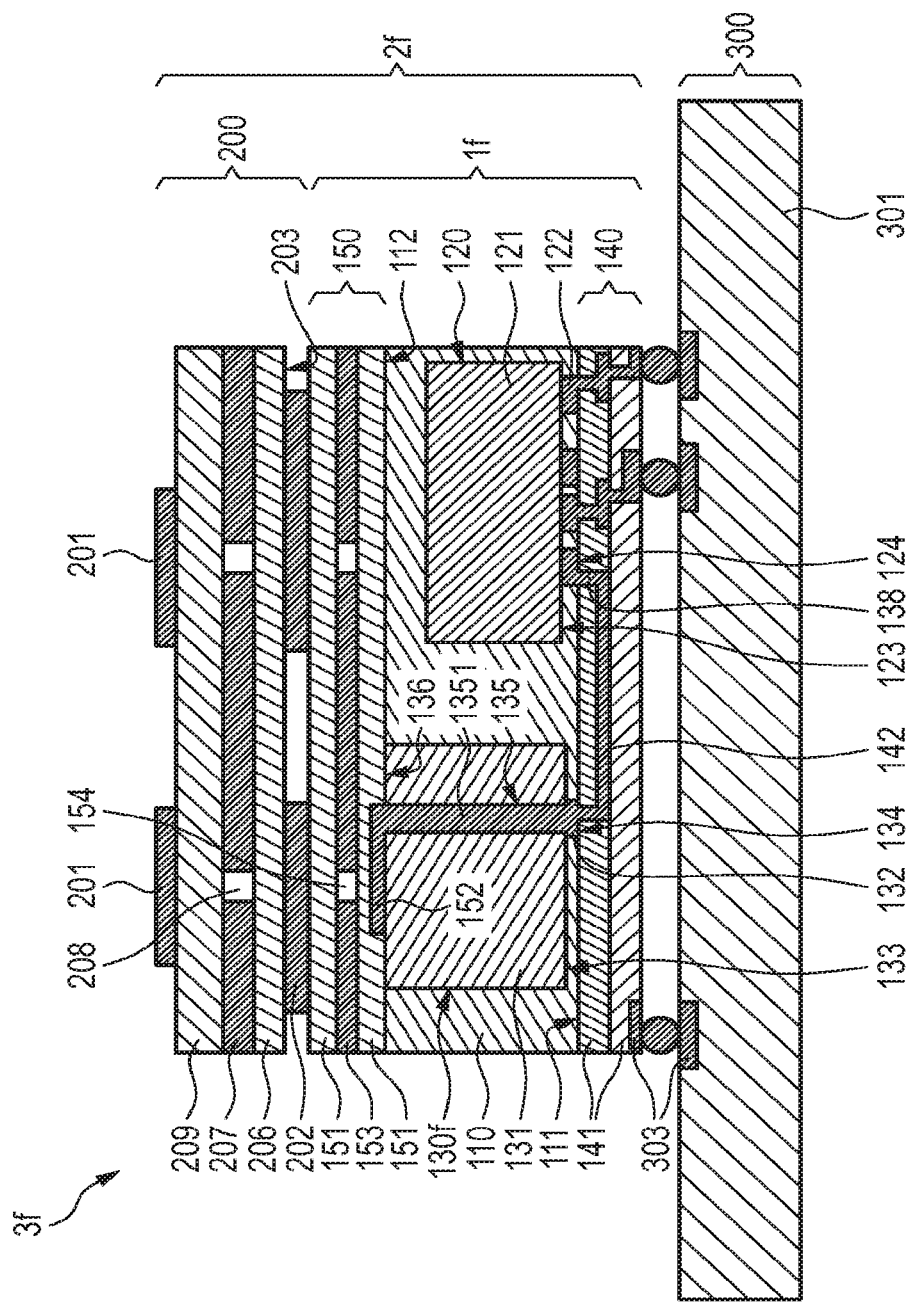
FIG. 8 shows a cross-sectional view of an embodiment of a microwave antenna package according to the present disclosure including a through package via plus aperture coupling.

FIG. 8 shows a cross-sectional view of a microwave antenna package 3f according to the present disclosure including a through package via plus aperture coupling. In particular, an aperture coupled patch antenna module 200 is placed on the eWLB package 1f to form the microwave antenna apparatus 2f, which is further flip-chipped on PCB arrangement 300 to make a complete functional system 3f. The antenna module 200 may comprise a single antenna or an array of antennas. The antenna coupling element 130f may be one block or multiple blocks feeding different antennas. If the feed network is designed on the antenna coupling element 130f then only one block could be sufficient to feed the antenna. There is a restriction to place a multiple antenna coupling block in the eWLB package dictated by some fabrication limitations (such as a certain epoxy to SMT components area-ratio).

The signal from the semiconductor element 120 will feed the microstrip line 142 in the RDL layer 140 using vias 138 in the RDL layer 140. This microstrip line 142 is connected with the microstrip line 152 on top of the antenna coupling element 130f through the RDL via 138 and through package via 1351 (as internal coupling component 135) through the antenna coupling element 130f, which is made of FR4 or any other substrate. This via 1351 will again feed the microstrip line 152 (in the RDL layer 150 at upper side 112 of the epoxy 110). This microstrip line 152 feeds the antenna module 200 through aperture coupling, for which purpose the RDL layer comprises aperture slots 154 in the ground layer 153 arranged between substrate layers 151.

The same concept can also be implemented using an RDL layer on one side of the eWLB package. In that case the microstrip line and ground plane will be placed on the antenna coupling component and only the antenna elements will be placed on top of the eWLB package.

Figure 9:
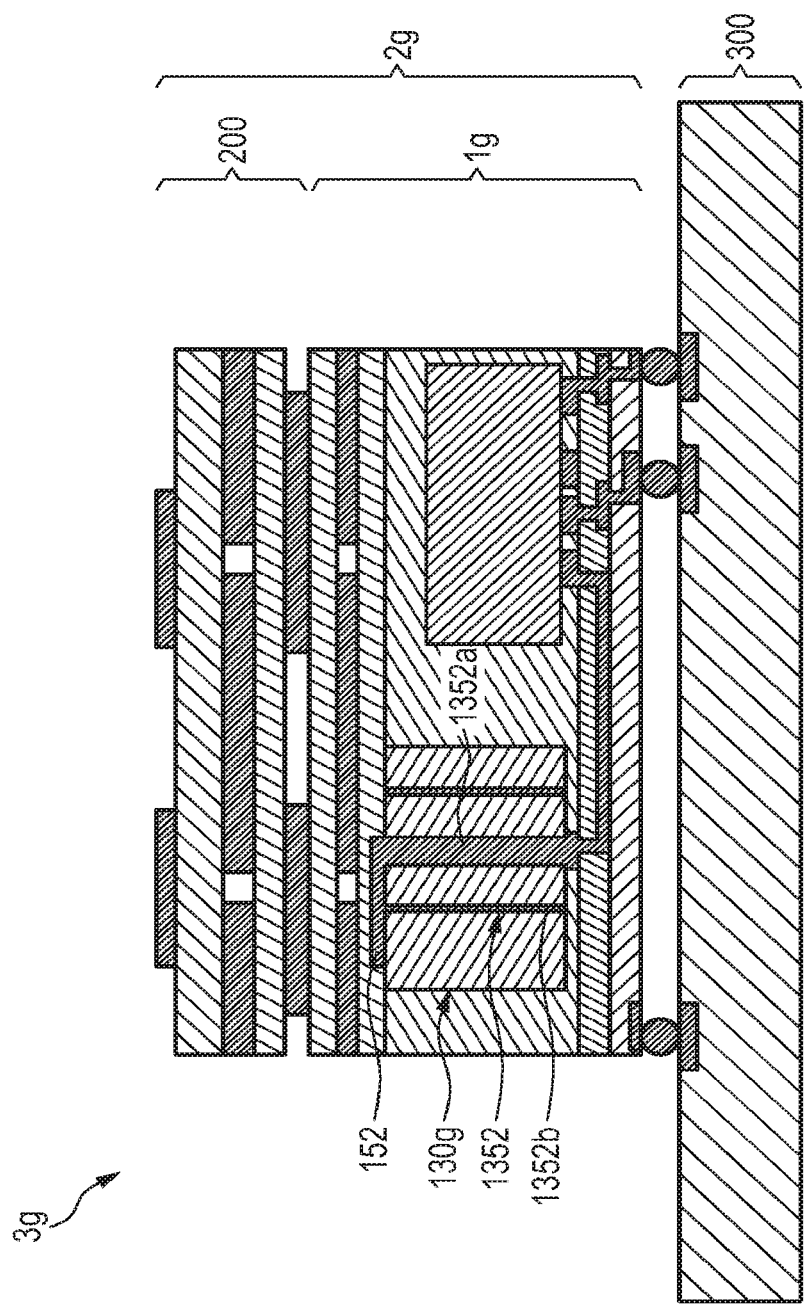
FIG. 9 shows a cross-sectional view of an embodiment of a microwave antenna package according to the present disclosure including a micro-coaxial coupling technique using vias.

FIG. 9 shows a cross-sectional view of a microwave antenna package 3g according to the present disclosure including a micro-coaxial coupling technique using vias. In particular, an aperture coupled patch antenna module 200 is placed on the eWLB package 1g to form the microwave antenna apparatus 2g, which is further flip-chipped on PCB arrangement 300 to make a complete functional system 3g. Different from the embodiment shown in FIG. 8, in this embodiment a micro-coaxial line 1352 (i.e. a coaxial coupling element as internal coupling component 135) is arranged through the antenna coupling element 130g. Walls of vias 1352b around a central feeding via 1352a act as shielding wall. The central feeding via 1352a will again feed the microstrip line 152.

Figure 10:
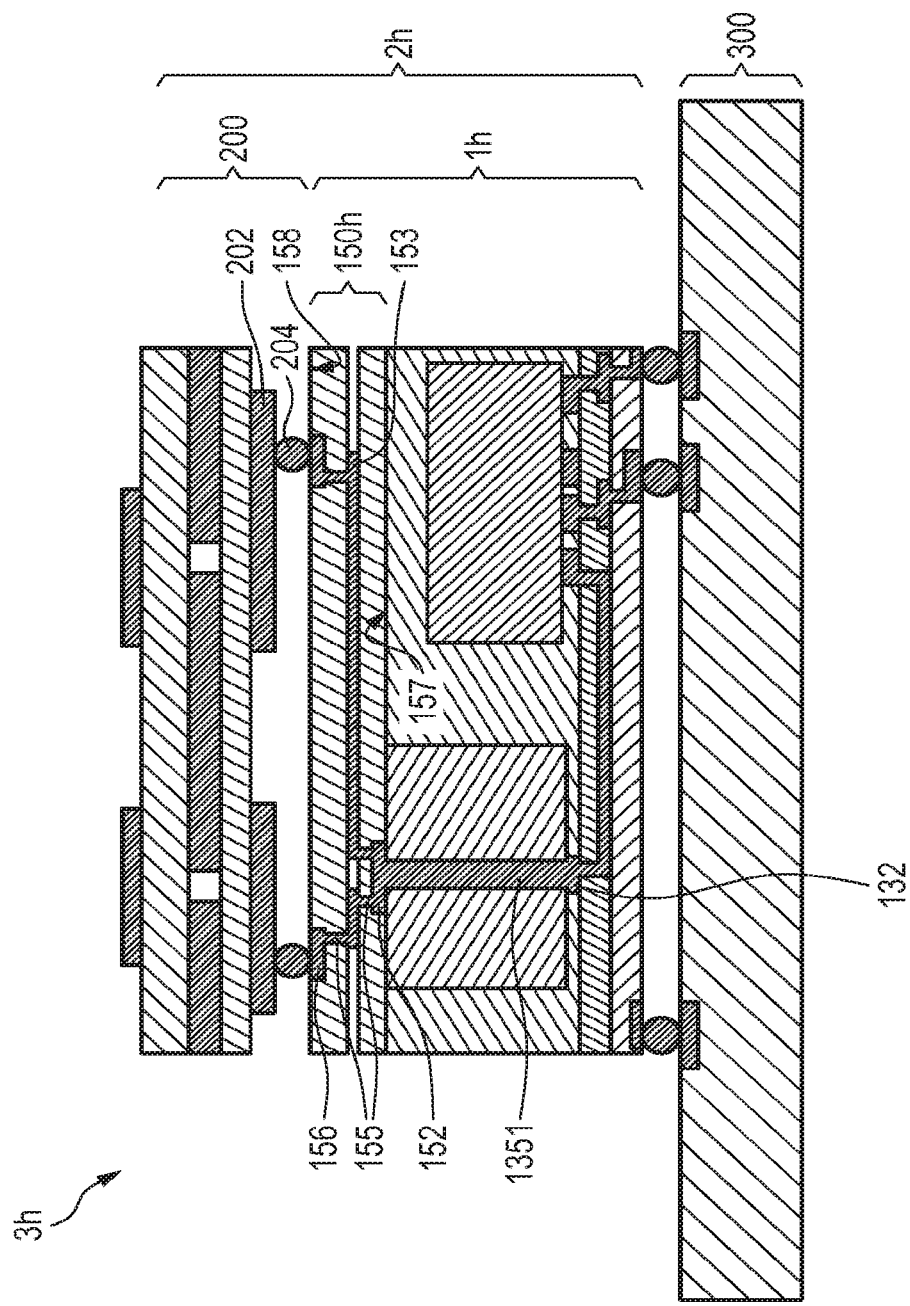
FIG. 10 shows a cross-sectional view of an embodiment of a microwave antenna package according to the present disclosure using a through package via and solder balls.

FIG. 10 shows a cross-sectional view of a microwave antenna package 3h according to the present disclosure using a through package via 1351 and solder balls 204. In particular, an aperture coupled patch antenna module 200 is placed on the eWLB package 1h via the solder balls 204 to form the microwave antenna apparatus 2h, which is further flip-chipped on PCB arrangement 300 to make a complete functional system 3h. Different from the embodiment shown in FIG. 8, in this embodiment the RDL layer 150h comprises a ground layer 153 arranged between substrate layers 151, a metal layer 152 (or, more generally, a conductive layer) arranged on a first surface 157 of the RDL layer 150h facing the mold layer 110 and another metal layer 156 (or, more generally, another conductive layer) arranged on a second surface 158 opposite the first surface 157. Vias 155 are arranged within the substrate layers 151 for connecting the metal layer 152 with another metal layer 156. With this arrangement direct contacts are provided for signal coupling between the through package via 1351 and the metal layers 132 and 152. The antenna module 200 is fed via another direct coupling between the metal layer 156 and the antenna feed line through the solder balls 204.

Figure 11:
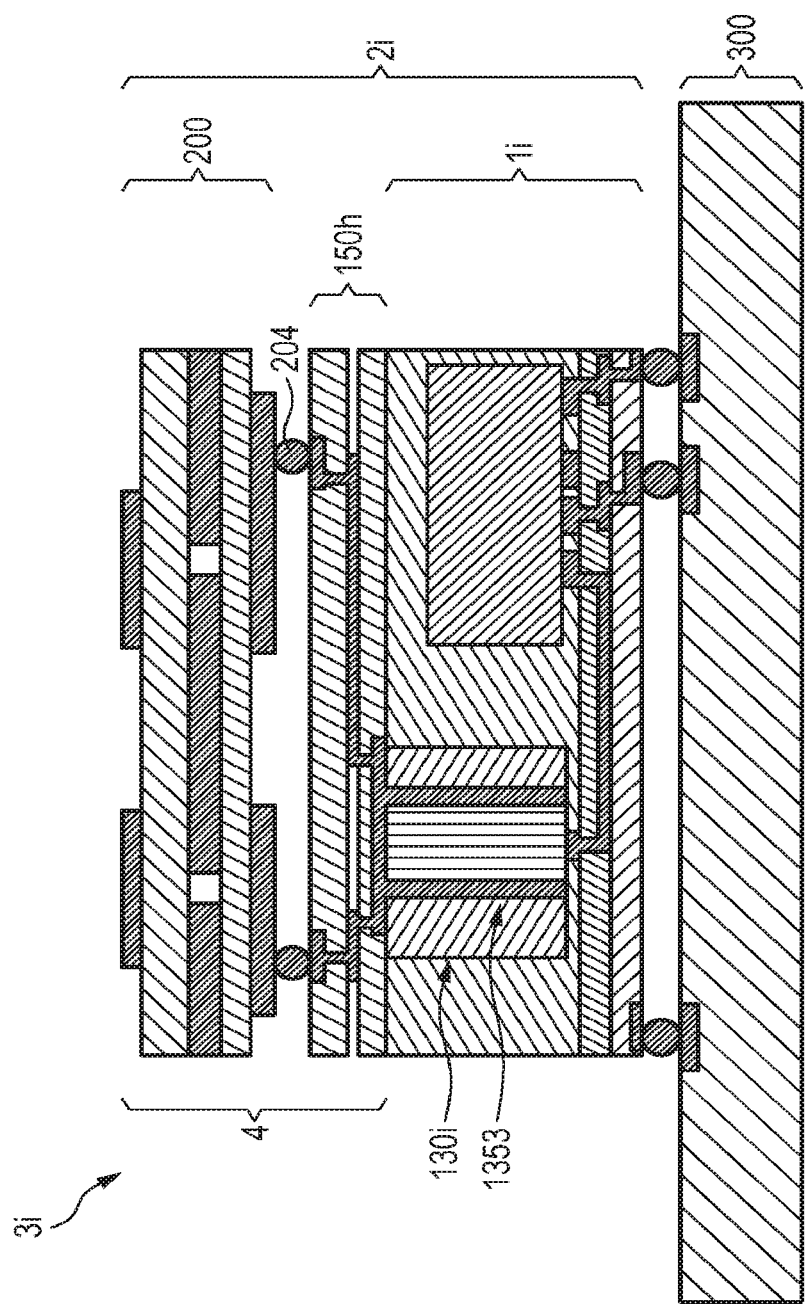
FIG. 11 shows a cross-sectional view of an embodiment of a microwave antenna package according to the present disclosure using a waveguide and solder balls.

FIG. 11 shows a cross-sectional view of a microwave antenna package 3i according to the present disclosure using a waveguide 1353 (as internal coupling component 135, e.g. in the form of a rectangular waveguide, which is metallized inside) within the antenna coupling element 130i. In particular, an aperture coupled patch antenna module 200 is placed on the RDL layer 150h via solder balls 204. The antenna module 200 together with the RDL layer 150h may together be formed as an RDL antenna module 4, which is then placed on the eWLB package 1i e.g. by gluing or soldering, to form the microwave antenna apparatus 2i, which is further flip-chipped on PCB arrangement 300 to make a complete functional system 3i. The RDL antenna module 4 has the advantage that it can be fabricated cheaper since no processing of the second surface of a wafer is required.

Figure 12:
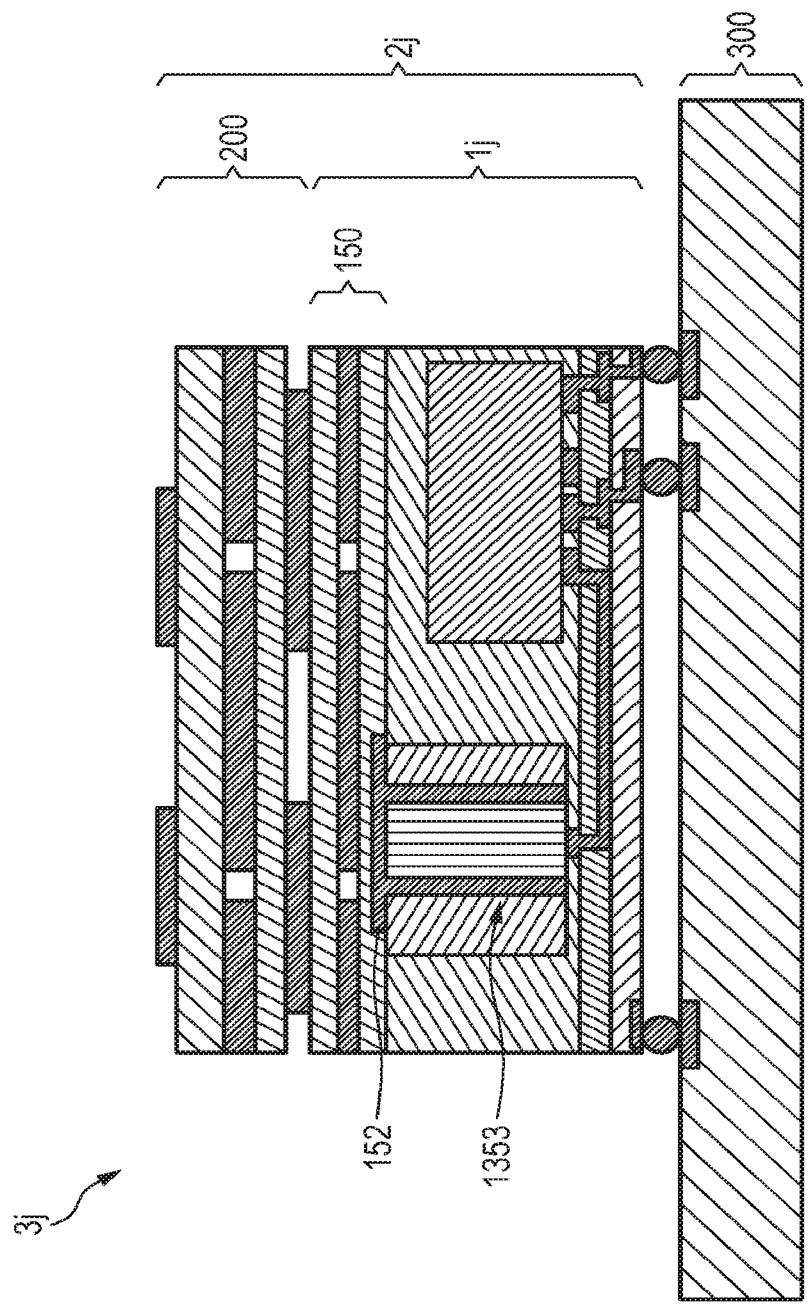
FIG. 12 shows a cross-sectional view of an embodiment of a microwave antenna package according to the present disclosure using a waveguide.

FIG. 12 shows a cross-sectional view of a microwave antenna package 3j according to the present disclosure using a waveguide 1353 (as internal coupling component 135) fed by an antenna integrated with aperture coupling interconnect. In particular, an aperture coupled patch antenna module 200 is placed on the eWLB package 1j to form the microwave antenna apparatus 2j, which is further flip-chipped on PCB arrangement 300 to make a complete functional system 3j. The waveguide 1353 feeds the microstrip line 152 in the RDL layer 150. This microstrip line 152 will eventually feed the antenna module 200 through aperture coupling.

Figure 13:
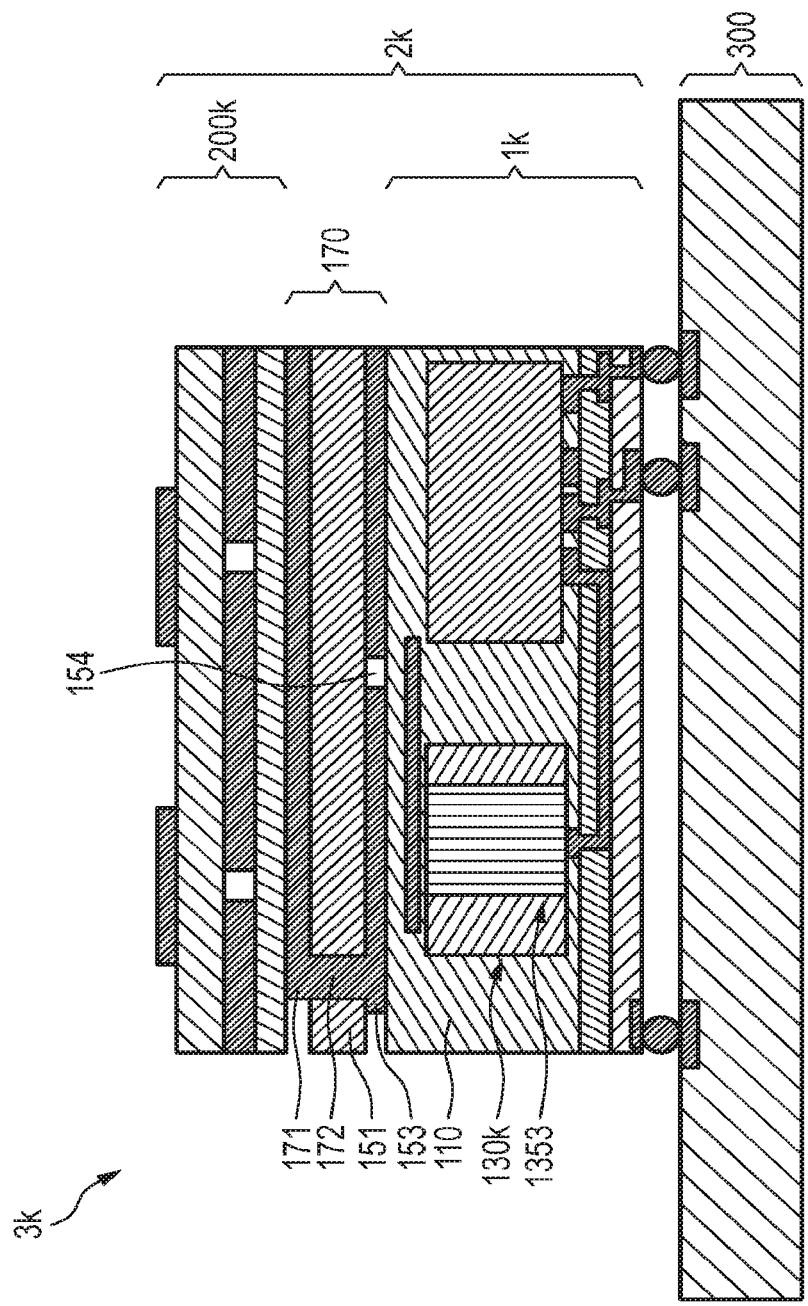
FIG. 13 shows a cross-sectional view of an embodiment of a microwave antenna package according to the present disclosure using a microstrip to slot transition.

FIG. 13 shows a cross-sectional view of a microwave antenna package 3k according to the present disclosure using a microstrip to slot line transition in embedded wafer level packaging, which is fed by antenna-fed or microstrip-fed waveguide 1353 (as internal coupling component) within the antenna coupling element 130k. In particular, an aperture coupled patch antenna module 200k is placed on a feeding arrangement 170, which is placed on the eWLB package 1k to form the microwave antenna apparatus 2k, which is further flip-chipped on PCB arrangement 300 to make a complete functional system 3k.

The feeding arrangement 170 comprises a substrate 151, a ground layer 153 comprising an aperture slot 154 arranged on a first surface of the substrate 151 facing the mold layer 110, a slot feed network 171 arranged on a second surface of the substrate 151 facing the antenna module 200k and a via 172 connecting the ground layer 153 and the slot feed network 171. The feed line 152 is arranged within the mold layer 110 in this embodiment.

Figure 14:
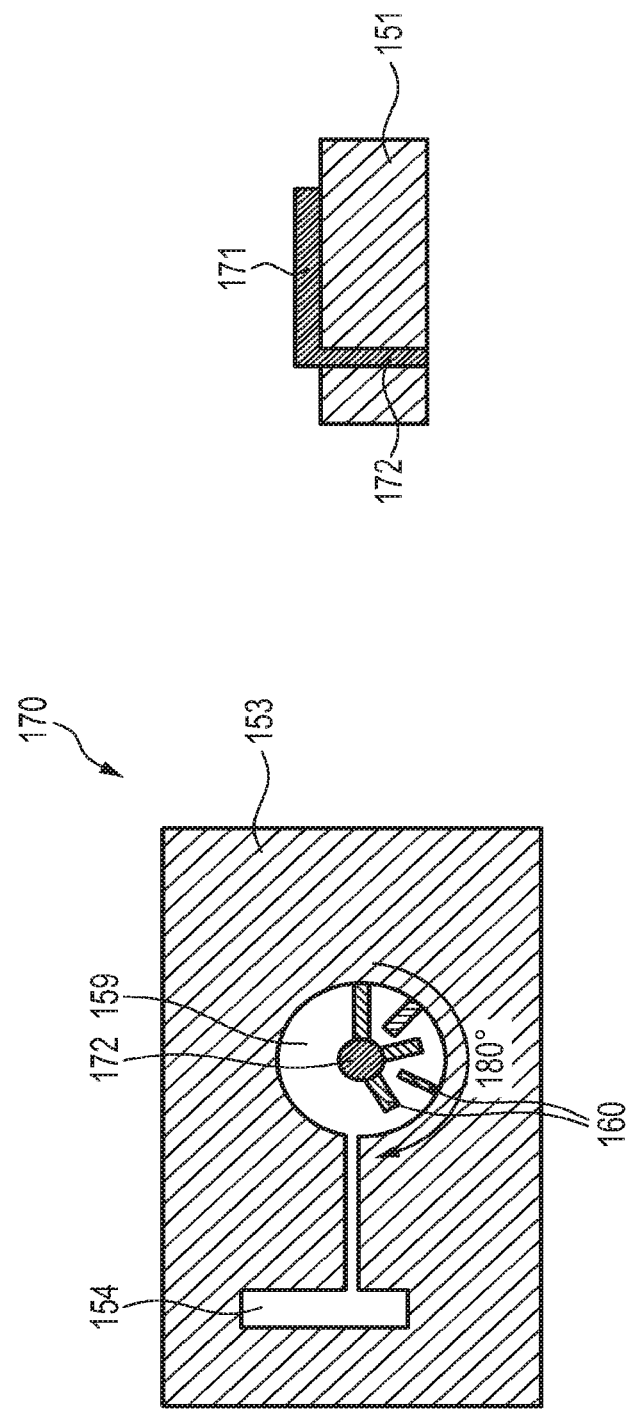
FIG. 14A shows a top view of a feeding arrangement as used in the microwave antenna package shown in FIG. 13.
FIG. 14B shows a side view of the feeding arrangement as used in the microwave antenna package shown in FIG. 13.

FIG. 14A shows a top view and FIG. 14B shows a side view of part of the feeding arrangement 170. As can be seen there, the ground layer 153 comprises a first aperture slot 154 for signal coupling with the antenna coupling element 130k and a second aperture slot 159 connected with the first aperture slot 154 for signal coupling with the metal layer 152. The first aperture slot 154 is preferably a rectangular aperture slot and the second aperture slot 159 is preferably a circular aperture slot. The signal will move from the first aperture slot 154 into the second aperture slot 159. Further, stubs 160 are arranged within the second aperture slot 159, preferably in a half section of it. The stubs 160 are used to introduce a phase shift of 180 degree in the signal. The topology overcome the bottleneck of aperture slot feeds, i.e. makes it a wideband feeding network, for which purpose the aperture slot generally needs to be narrow, i.e. it provides an advantage in terms of a wider bandwidth. The via 172 in the second aperture slot 159 will take the signal and then feed the aperture coupled patch antenna array 200k.

The waveguide 1353 can be replaced with a through package via (as shown e.g. in FIGS. 8 and 10) which is interconnected with a microstrip line on top of the antenna coupling element feeding the aperture on the bottom-most layer of the antenna module.

Figure 15:
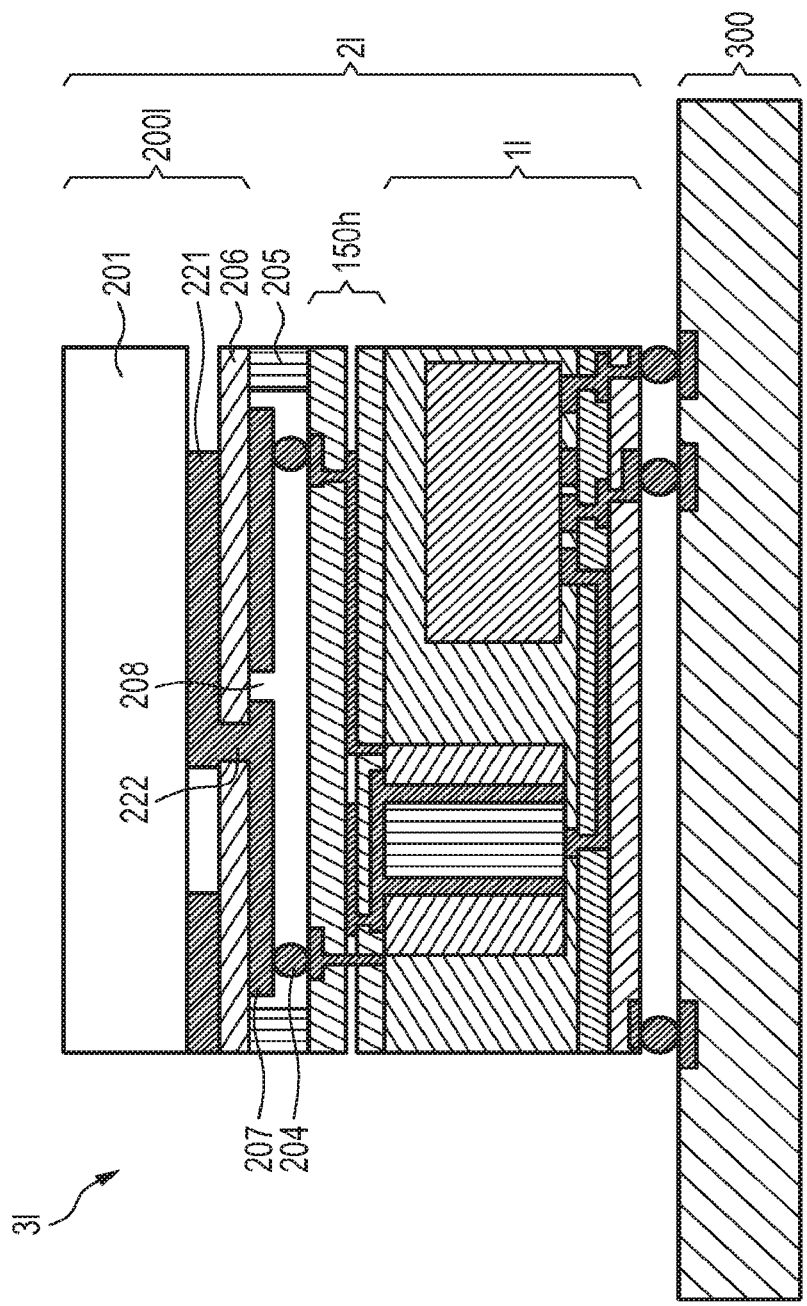
FIG. 15 shows a cross-sectional view of an embodiment of a microwave antenna package according to the present disclosure using a waveguide coupling including spacers.

FIG. 15 shows a cross-sectional view of an embodiment of a microwave antenna package 3l according to the present disclosure using a waveguide coupling including spacers. In particular, an aperture coupled patch antenna module 200l is placed on an RDL 150h (see FIG. 11), which is placed on the eWLB package 1l to form the microwave antenna apparatus 2l, which is further flip-chipped on PCB arrangement 300 to make a complete functional system 3l. The antenna module 200l comprises an antenna element 201, a slot feed network 221, a substrate 206, a ground layer 207 with aperture slots 208 and a via 222 for connecting the slot feed network 221 and the ground layer 207.

The dimension of the solder balls 204 depends on the soldering process. Therefore, the distance between antenna and embedded wafer level package may vary if the disclosed interconnect technique (waveguide fed by an antenna integrated with solder balls interconnect; see FIG. 11) is employed. Additional spacers are thus placed between the antenna module 200l and the RDL layer 150h to achieve a constant distance there between. This approach can also be employed to other coupling techniques, e.g. the microcoaxial coupling technique illustrated in FIG. 9.

With the disclosed solutions various advantages can be achieved. In particular, with the disclosed transitions PoP antennas can be designed. Beam width and gain can be better controlled, which will allow us to avoid the deteriorating effects of floating ground plane. The ripple caused by the reflector and epoxy could be reduced when integrating highly radiation efficient antennas. Different types of PoP antennas can be fed from the semiconductor element. A performance deteriorating effect of epoxy can be mitigated to some extent to already existing techniques. Complete mm-wave system integration on package level can be achieved without any need for external antennas.

Further, the disclosed PoP concept will allow designing antennas and controlling the beam width and gain by using highly directional antennas and arrays, which were difficult to integrate in eWLB before because of limited space. PoP antennas along with its proposed transitions provide increased flexibility of designing antennas by completely avoiding the restriction of chip-to-SMT-component area ratio. Further, a wide variety of interconnects, suitable for different applications, can be now integrated with eWLB package in a very compact form, enabling the miniaturized 3D RF packaging concept. Still further, a number of coupling techniques have been proposed which will be the enabler to fabricate PoP antennas to enhance the performance and achieve the objective of designing antennas with desired beam width (with some limitations) for future 60 GHz and beyond radar sensors.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

It follows a list of further embodiments of the disclosed subject matter:

1. Microwave antenna coupling apparatus (1) comprising:
   a mold layer (110) of mold material,
   a semiconductor element (120) comprising a semiconductor unit (121) and a semi-conductor feed line (122) arranged on a first surface (123) of the semiconductor unit (121), wherein the semiconductor element is arranged within the mold layer (110) such that an outer surface (124) of the semiconductor feed line (122) is not covered by mold material,
   an antenna coupling element (130) comprising a coupling unit (131), a coupling feed line (132) arranged on a first surface (133) of the coupling unit (131) and an internal coupling component (135) to provide signal coupling between the coupling feed line (132) and the second surface (136) of the coupling unit (131), wherein the antenna coupling element (130) is arranged within the mold layer (110) separate from the semiconductor element (120) and such that an outer surface (134) of the coupling feed line (132) is not covered by mold material, and a redistribution layer (140) comprising at least one redistribution substrate layer (141) and a conductive layer (142), wherein the redistribution layer (140) is arranged on a first surface (111) of the mold layer (110) and configured such that the conductive layer (142) connects the outer surface (124) of the semiconductor feed line (122) with the outer surface (134) of the coupling feed line (132).

2. Microwave antenna coupling apparatus as defined in any preceding embodiment, wherein the antenna coupling element (130) is arranged within the mold layer (110) such that the second surface (136) of the coupling unit (131) is not covered by mold material.

3. Microwave antenna coupling apparatus as defined in any preceding embodiment, comprising two or more antenna coupling elements for coupling with two or more antenna elements of a microwave antenna apparatus.

4. Microwave antenna coupling apparatus as defined in any preceding embodiment, further comprising another redistribution layer (150) comprising at least one redistribution substrate layer (151) and a conductive layer (152), wherein the another redistribution layer (150) is arranged on a second surface (112) of the mold layer (110) opposite the first surface (111) and configured for signal coupling between the conductive layer (152) and the internal coupling component (135).

5. Microwave antenna coupling apparatus as defined in embodiment 4, wherein the another redistribution layer (150) further comprises a ground layer (153) provided with at least one aperture slot (154) for aperture coupling.

6. Microwave antenna coupling apparatus as defined in embodiment 4, wherein the another redistribution layer (150) further comprises vias (155) for connecting the conductive layer (152) with another conductive layer (156).

7. Microwave antenna coupling apparatus as defined in embodiment 4, wherein the conductive layer (152) is arranged on a first surface (157) of the another redistribution layer (150) facing the mold layer and the ground layer (153) is arranged within the another redistribution layer (150).

8. Microwave antenna coupling apparatus as defined in embodiment 4, wherein the ground layer (153) is arranged on a first surface (157) of the another redistribution layer (150) facing the mold layer and the conductive layer (152) is arranged with the another redistribution layer (150) or on a second surface (158) opposite the first surface (157).

9. Microwave antenna coupling apparatus as defined in any preceding embodiment, wherein the internal coupling component comprises a through package via (1351) connecting the coupling feed line (132) with the second surface (136) of the coupling unit (131).

10. Microwave antenna coupling apparatus as defined in any preceding embodiment, wherein the internal coupling component comprises a coaxial coupling element (1352) connecting the coupling feed line (132) with the second surface (136) of the coupling unit (131).

11. Microwave antenna coupling apparatus as defined in embodiment 10, wherein said coaxial coupling element (1352) comprises as central feeding via (1352a) and a surrounding shielding via (1352b).

12. Microwave antenna coupling apparatus as defined in any preceding embodiment, wherein the internal coupling component comprises a waveguide (1353).

13. Microwave antenna coupling apparatus as defined in any preceding embodiment,
wherein the antenna coupling element (130) is arranged within the mold layer (110) such that the second surface (136) of the coupling unit (131) is covered by mold material and another coupling feed line (152) is arranged on or close to the second surface (136) of the coupling unit (131).

14. Microwave antenna coupling apparatus as defined in embodiment 5, wherein the ground layer (153) comprises a first aperture slot (154) for signal coupling with the antenna coupling element (130) and a second aperture slot (159) connected with the first aperture slot (154) for signal coupling with the conductive layer (152).

15. Microwave antenna coupling apparatus as defined in embodiment 14, wherein the first aperture slot (154) is a rectangular aperture slot and the second aperture slot (159) is a circular aperture slot.

16. Microwave antenna coupling apparatus as defined in embodiment 14 or 15, wherein stubs (160) are arranged within the second aperture slot (159).

17. Microwave antenna apparatus (2) comprising:
a microwave antenna coupling apparatus (1) as defined in any preceding embodiment and
an antenna module (200) coupled to the microwave antenna coupling apparatus on a surface opposite the redistribution layer (140), said antenna module comprising one or more antenna elements (201).

18. Microwave antenna apparatus as defined in embodiment 17, wherein said antenna module comprises an antenna feed line (202) arranged in or on a surface (203) of the antenna module facing the microwave antenna coupling apparatus and coupling the one or more antenna elements (201) to the antenna coupling element (130) of the microwave antenna coupling apparatus.

19. Microwave antenna apparatus as defined in embodiment 17 or 18, wherein said one or more antenna elements (201) comprises one or more antennas selected from a group of antennas comprising patch antennas, aperture coupled patch antennas, dipole antennas, folded dipole antennas, monopole antennas, substrate integrated waveguide slot antennas, fractal antennas, slot antennas, rod antennas, resonator antennas, helical antennas, antenna arrays, loop antennas, resonant cavity antennas, broad side antennas, end fire antennas, and waveguide antennas.

20. Microwave antenna apparatus as defined in any one of embodiments 17 to 19,
wherein said one or more antenna elements (201) comprises a single antenna element, an array of antenna elements or antenna elements forming a MIMO configuration.

21. Microwave antenna apparatus as defined in any one of embodiments 17 to 20, wherein the antenna module (200) is coupled to the microwave antenna coupling apparatus by solder balls (204).

22. Microwave antenna apparatus as defined in embodiment 21, further comprising spacers (205) between the antenna module (200) and the microwave antenna coupling apparatus.

23. Microwave antenna package (3) comprising
a PCB arrangement (300) comprising a PCB layer (301) and a microwave antenna apparatus (2) as defined in any one of embodiments 17 to 22 coupled to the PCB arrangement.

24. Microwave antenna package (3d) as defined in embodiment 23, further comprising
a frequency selective surface structure (400) arranged at a distance from the microwave antenna apparatus (2) on a side of the microwave antenna apparatus (2) facing away from the PCB arrangement (300), and
a support structure (401) for supporting the frequency selective surface structure (400).

The invention claimed is:

1. Microwave antenna coupling apparatus comprising:
a mold layer of mold material;
a semiconductor element comprising a semiconductor unit and a semi-conductor feed line arranged on a first surface of the semiconductor unit, wherein the semiconductor element is arranged within the mold layer such that an outer surface of the semiconductor feed line is not covered by mold material;
an antenna coupling element comprising a coupling unit, a coupling feed line arranged on a first surface of the coupling unit and an internal coupling component to provide signal coupling between the coupling feed line and the second surface of the coupling unit, wherein the antenna coupling element is arranged within the mold layer separate from the semiconductor element and such that an outer surface of the coupling feed line is not covered by mold material;
a redistribution layer comprising at least one redistribution substrate layer and a conductive layer, wherein the redistribution layer is arranged on a first surface of the mold layer and configured such that the conductive layer connects the outer surface of the semiconductor feed line with the outer surface of the coupling feed line; and
another redistribution layer comprising a ground layer, at least one redistribution substrate layer, and a conductive layer, wherein the another redistribution layer is arranged on a second surface of the mold layer opposite the first surface and configured for signal coupling between the conductive layer and the internal coupling component, the ground layer comprising a first aperture slot for signal coupling with the antenna coupling element and a second aperture slot connected with the first aperture slot for signal coupling with the conductive layer.

2. Microwave antenna coupling apparatus as claimed in claim 1, wherein the antenna coupling element is arranged within the mold layer such that the second surface of the coupling unit is not covered by mold material.

3. Microwave antenna coupling apparatus as claimed in claim 1, comprising two or more antenna coupling elements for coupling with two or more antenna elements of a microwave antenna apparatus.

4. Microwave antenna coupling apparatus as claimed in claim 1, wherein the another redistribution layer further comprises vias for connecting the conductive layer with another conductive layer.

5. Microwave antenna coupling apparatus as claimed in claim 1, wherein the conductive layer is arranged on a first surface of the another redistribution layer facing the mold layer and the ground layer is arranged within the another redistribution layer.

6. Microwave antenna coupling apparatus as claimed in claim 1, wherein the ground layer is arranged on a first surface of the another redistribution layer facing the mold layer and the conductive layer is arranged within the another redistribution layer or on a second surface opposite the first surface.

7. Microwave antenna coupling apparatus as claimed in claim 1, wherein the internal coupling component comprises a through package via connecting the coupling feed line with the second surface of the coupling unit.

8. Microwave antenna coupling apparatus as claimed in claim 1, wherein the internal coupling component comprises a coaxial coupling element connecting the coupling feed line with the second surface of the coupling unit.

9. Microwave antenna coupling apparatus as claimed in claim 8, wherein said coaxial coupling element comprises as central feeding via and a surrounding shielding via.

10. Microwave antenna coupling apparatus as claimed in claim 1, wherein the internal coupling component comprises a waveguide.

11. Microwave antenna coupling apparatus as claimed in claim 1, wherein the antenna coupling element is arranged within the mold layer such that the second surface of the coupling unit is covered by mold material and another coupling feed line is arranged on or close to the second surface of the coupling unit.

12. Microwave antenna coupling apparatus as claimed in claim 1, wherein the first aperture slot is a rectangular aperture slot and the second aperture slot is a circular aperture slot.

13. Microwave antenna coupling apparatus as claimed in claim 1, wherein stubs are arranged within the second aperture slot.

14. Microwave antenna apparatus comprising:
a microwave antenna coupling apparatus as claimed in claim 1; and
an antenna module coupled to the microwave antenna coupling apparatus on a surface opposite the redistribution layer, said antenna module comprising one or more antenna elements.

15. Microwave antenna apparatus as claimed in claim 14, wherein said antenna module comprises an antenna feed line arranged in or on a surface of the antenna module facing the microwave antenna coupling apparatus and coupling the one or more antenna elements to the antenna coupling element of the microwave antenna coupling apparatus.

16. Microwave antenna package comprising:
a PCB arrangement comprising a PCB layer; and
a microwave antenna apparatus as claimed in claim 14 coupled to the PCB arrangement.

17. Microwave antenna package as claimed in claim 16, further comprising:
a frequency selective surface structure arranged at a distance from the microwave antenna apparatus on a side of the microwave antenna apparatus facing away from the PCB arrangement; and
a support structure for supporting the frequency selective surface structure.

* * * * *